(12) United States Patent
Morishita

(10) Patent No.: US 7,992,112 B2
(45) Date of Patent: Aug. 2, 2011

(54) HARDWARE VERIFICATION PROGRAMMING DESCRIPTION GENERATION APPARATUS, HIGH-LEVEL SYNTHESIS APPARATUS, HARDWARE VERIFICATION PROGRAMMING DESCRIPTION GENERATION METHOD, HARDWARE VERIFICATION PROGRAM GENERATION METHOD, CONTROL PROGRAM AND COMPUTER-READABLE RECORDING MEDIUM

(75) Inventor: Takahiro Morishita, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 901 days.

(21) Appl. No.: 11/929,304

(22) Filed: Oct. 30, 2007

(65) Prior Publication Data

US 2008/0109777 A1 May 8, 2008

(30) Foreign Application Priority Data

Nov. 7, 2006 (JP) ................................. 2006-302124

(51) Int. Cl.
*G06F 9/45* (2006.01)
*G06F 17/50* (2006.01)

(52) U.S. Cl. ........................ 716/104; 716/105; 716/106

(58) Field of Classification Search .................. 716/4–6, 716/104–106; 703/13–14
See application file for complete search history.

(56) References Cited

U.S. PATENT DOCUMENTS

| 6,993,469 B1 * | 1/2006 | Bortfeld ........................... 703/15 |
| 7,062,728 B2 * | 6/2006 | Tojima ............................ 716/103 |
| 7,266,791 B2 * | 9/2007 | Morishita et al. .................. 716/4 |
| 2004/0230414 A1 * | 11/2004 | Hoppe et al. ..................... 703/14 |
| 2004/0237056 A1 * | 11/2004 | Okada ................................ 716/2 |
| 2005/0010387 A1 * | 1/2005 | Morishita et al. ............... 703/14 |
| 2005/0144585 A1 * | 6/2005 | Daw et al. ......................... 716/18 |
| 2006/0288337 A1 * | 12/2006 | Nishi .............................. 717/136 |
| 2007/0129924 A1 * | 6/2007 | Verheyen et al. ............... 703/14 |
| 2008/0098336 A1 * | 4/2008 | Tanimoto et al. .................. 716/3 |

FOREIGN PATENT DOCUMENTS

| JP | 5-101141 A | 4/1993 |
| JP | 2001-14356 A | 1/2001 |
| JP | 2006-139729 A | 6/2006 |

* cited by examiner

*Primary Examiner* — Paul Dinh
*Assistant Examiner* — Patrick Sandoval
(74) *Attorney, Agent, or Firm* — Birch, Stewart, Kolasch & Birch, LLP

(57) ABSTRACT

A hardware verification programming description generation apparatus includes: a behavior synthesis section, for a circuit of hardware that operates in accordance with a multi-phase clock, for dividing the hardware into blocks corresponding to clock systems and performing a behavior synthesis on each of the divided blocks, based on a behavioral description, the behavioral description only describing a process behavior of the hardware but does not describe information regarding a structure of the hardware; and a clock precision model generation section for generating clock precision models using the behavior-synthesized data, the clock precision model capable of verifying the hardware at a cycle precision level.

22 Claims, 6 Drawing Sheets

US 7,992,112 B2

HARDWARE VERIFICATION PROGRAMMING DESCRIPTION GENERATION APPARATUS, HIGH-LEVEL SYNTHESIS APPARATUS, HARDWARE VERIFICATION PROGRAMMING DESCRIPTION GENERATION METHOD, HARDWARE VERIFICATION PROGRAM GENERATION METHOD, CONTROL PROGRAM AND COMPUTER-READABLE RECORDING MEDIUM

This Nonprovisional application claims priority under 35 U.S.C. §119(a) on Patent Application No. 2006-302124 filed in Japan on Nov. 7, 2006, the entire contents of which are hereby incorporated by reference.

BACKGROUND OF THE INVENTION

1. Field of the Invention

The present invention relates to: a hardware verification programming description generation apparatus for generating a model as a general programming description that can verify, at a cycle precision level, a process behavior of a circuit of hardware operating in accordance with a multi-phase clock; a high-level synthesis apparatus; a hardware verification programming description generation method using the hardware verification programming description generation apparatus; a hardware verification program generation method using the hardware verification programming description generation method; a hardware verification programming description generation program for causing a computer to execute the procedure of processes of the hardware verification programming description generation method; a control program (e.g., hardware verification program) using the hardware verification programming description generation program; and a computer-readable recording medium having the control program recorded thereon.

2. Description of the Related Art

In a conventional development of system LSI, it is necessary to verify whether a behavior of a circuit of designed hardware satisfies the specification required by a system. Conventionally, a hardware description language (HDL) simulator is used in order to perform a verification at a cycle precision level. The cycle precision level to be described herein refers to a precision level that can show the state of hardware in a clock cycle unit in a behavior of a circuit of the hardware. For example, in hardware operating in synchronization with a rising edge of a clock, the state of a memory device (e.g., register, memory or the like) in the hardware at the rising edge of the clock is shown. In the HDL simulator, a performance (e.g., operation speed or the like) is measured so as to verify whether a required specification is satisfied. Generally, in the HDL simulator, a behavior of a circuit that is described by a hardware description language such as VHDL is simulated. The simulation is performed by an event-driven system by the HDL simulator monitoring the change in a signal in a circuit in a time unit that is shorter than a clock cycle, and the change in the signal in the circuit is transmitted to a signal in a circuit connected to the circuit having the changed signal.

Further, in the conventional development of LSI system, the design of hardware is sometimes performed using a multi-phase clock. In this case, when the hardware is designed, processes having relevancy to each other are gathered and divided into function blocks. In order to satisfy the functional specification required by the hardware, the clock frequency of a function block that has to perform an operation at a high speed is set high such that the clock cycle thereof is short. On the other hand, the clock frequency of a function block that dose not has to perform an operation at a high speed is set low such that the clock cycle thereof is long. As described above, the hardware is designed so as to include function blocks that operate at clock cycles different from each other for one hardware, and the behavior of the circuit of the hardware is verified.

For example, Reference 1 discloses a method in which a verification model is generated by a general programming language and the verification of hardware at a cycle precision level is performed at a high speed, by analyzing a behavioral description of the hardware, generating a control data flow graph (CDFG) based on the behavioral description of the hardware, and creating a behavioral description that shows the behaviors of all the computations based on the information of a behavior of the hardware that are divided into states and data path information. The behavioral description of the hardware only describes a process behavior of the hardware but does not describe information regarding a structure of the hardware. In addition, the CDFG represents nodes, in which operations (e.g., computations or the like) are performed by hardware, and branches connecting between the nodes for a flow of data.

For example, Reference 2 discloses a method for generating a clock precision verification programming description for hardware for the purpose of verifying a process behavior of the hardware at a higher speed than the HDL simulator. This method will be described with reference to FIG. 6.

FIG. 6 is a block diagram showing an exemplary essential structure of a conventional hardware verification programming description generation apparatus.

As shown in FIG. 6, first, a behavior synthesis section 61 generates CDFG data 72 based on a behavioral description 71 of a circuit of hardware operating in accordance with a single-phase clock. Next, the CDFG data 72 is scheduled according to an operating frequency required by a hardware specification and allocated for states. Thereafter, a clock precision model generation section 62 generates behavior models for respective nodes using the operation information of the nodes that is included in the CDFG data 72 and decides the order of the computations of the behavior models for the respective nodes using node connection information. Therefore, the clock precision model generation section 62 generates a model that can be simulated at each state and generates a HW clock precision description 73 that can verify the hardware at a cycle precision level.

For example, Reference 3 discloses a conventional technique of a high-level synthesis method that is also used in the present invention.

[Reference 1] Japanese Laid-Open Publication No. 2001-14356

[Reference 2] Japanese Laid-Open Publication No. 2006-139729

[Reference 3] Japanese Laid-Open Publication No. 5-101141

SUMMARY OF THE INVENTION

However, the conventional hardware verification method described above has the following problems.

In the conventional verification method for performing a simulation by the event-driven system using the HDL simulator, the time unit of the simulation is shorter than a clock cycle. Therefore, when hardware is verified at a cycle precision level, much redundancy and much wasted time occur, which results in a problem of low efficiency. In addition, when the size of a circuit of hardware to be verified is large or a test pattern to be used is long, an amount of computation to be required for the simulation becomes extremely large, which results in taking too much time for performing the simulation. Further, a HDL simulator is at a high cost, which causes a problem of increasing the development cost of system LSI.

When a circuit of hardware operating in accordance with a multi-phase clock is verified by using the HDL simulator of the event-driven system, it takes too much time for the simulation, as described above.

In the verification method at the conventional cycle precision level disclosed in Reference 1, a verification model is intended for a circuit of hardware operating in accordance with a single-phase clock. Therefore, the verification method disclosed in Reference 1 cannot verify hardware operating in a multi-phase clock. In other words, it is not possible to generate a model that can verify hardware operating in a multi-phase clock.

In addition, even in the conventional verification method at the cycle precision level disclosed in Reference 2, the generated HW clock precision description 73 is intended for a circuit of hardware operating in a single-phase clock. Therefore, the verification method disclosed in Reference 2 cannot verify hardware operating in a multi-phase clock.

As described above, the conventional verification methods described above have the problems that the design and verification periods for the hardware operating in accordance with a multi-phase clock are significantly lengthened, and the development cost is increased.

The present invention is intended to solve the problems described above. The objective of the present invention is to provide: a hardware verification programming description generation apparatus for generating a model as a general programming description that can verify, at a cycle precision level, the hardware operating in accordance with a multi-phase clock, verifying a behavior of the circuit of the hardware at a high speed and at a low cost, shortening the design and verification periods for the hardware, and implementing the development of system LSI at a low cost; a high-level synthesis apparatus; a hardware verification programming description generation method using the hardware verification programming description generation apparatus; a hardware verification program generation method using the hardware verification programming description generation method; a control program that is a hardware verification programming description generation program for causing a computer to execute the hardware verification programming description generation method; and a computer-readable recording medium having the control program recorded thereon.

A hardware verification programming description generation apparatus according to the present invention includes: a behavior synthesis section, for a circuit of hardware that operates in accordance with a multi-phase clock, for dividing the hardware into blocks corresponding to clock systems and performing a behavior synthesis on each of the divided blocks, based on a behavioral description, the behavioral description only describing a process behavior of the hardware but does not describe information regarding a structure of the hardware; and a clock precision model generation section for generating clock precision models using the behavior-synthesized data, the clock precision model capable of verifying the hardware at a cycle precision level, thereby the objective described above being achieved.

Preferably, a hardware verification programming description generation apparatus according to the present invention further includes: a clock control model generation section for generating a control model for controlling the order of the computations of the clock precision models for the respective blocks of the clock systems when the hardware is simulated at the cycle precision level.

More preferably, in a hardware verification programming description generation apparatus according to the present invention, the behavior synthesis section includes: a behavior description analysis section for analyzing the behavioral description of the hardware and obtaining behavior information of the hardware; a clock domain division section for dividing the hardware into blocks corresponding to the clock systems based on the behavior information of the hardware; and a control data flow graph generation section for creating a control data flow graph for the respective blocks of the clock systems based on the behavioral description of the hardware, the control data flow graph representing the behavior of the hardware using nodes and branches connecting between the nodes.

More preferably, in a hardware verification programming description generation apparatus according to the present invention, the clock precision model generation section includes: a scheduling/state allocation section for scheduling the nodes in the control data flow graph as the behavior-synthesized data according to respective clock frequencies of the blocks and allocating the nodes for respective states; and a cycle precision model generation section for generating behavior models as the clock precision models for each of the states, the behavior models capable of verifying the hardware at a cycle precision level using a result obtained from the scheduling/state allocation.

More preferably, in a hardware verification programming description generation apparatus according to the present invention, the hardware verification programming description generation apparatus generates at least one of the clock precision models and the control model as a description represented by a general programming language.

More preferably, in a hardware verification programming description generation apparatus according to the present invention, the clock control model generation section compares times, at which the computations of the cycle precision models for the respective blocks of the clock systems are performed, selects a time which is the shortest up to when a computation is performed and selects the block of the clock system corresponding to the time as a block on which the computation is performed, for the selected block, the clock control model generation section updates a time at which a next computation of the cycle precision model is performed to a value of a clock cycle of the selected block, for a block other than the selected block, the clock control model generation section subtracts the shortest time from a time up to when a cycle precision model is computed, and the clock control model generation section sequentially repeats, in a similar manner, a process for selecting a time which is the shortest up to when a computation is performed and selecting a block corresponding to the time, and a process for updating the time up to when a next computation of a clock precision model is performed.

More preferably, in a hardware verification programming description generation apparatus according to the present invention, the clock control model generation section repeats a process of: computing a time corresponding to a greatest common denominator of clock cycles for the blocks of the respective clock systems, adding the time corresponding to the greatest common denominator to each of values of respective counters that shows a time at which a computation of a cycle precision model is performed on a corresponding block of a clock system, when the clock cycle for each of the blocks of the respective clock systems and the value of the corresponding counter match each other, determining that the computation of the clock precision model for the block is to be performed, and initializing the value of the counter for which the computation of the clock precision model for the block has been performed, and for the other blocks, determining that the computations of the clock precision models for the respective blocks are not to be performed, and adding the time corresponding to the greatest common denominator to the values of the respective counters.

More preferably, in a hardware verification programming description generation apparatus according to the present invention, the clock control model generation section analyzes, based on the behavioral description of the hardware, times at which operations of circuits designated to respective clock systems are started and controls times at which the computations of the clock precision models for the respective blocks of the clock systems are started.

More preferably, in a hardware verification programming description generation apparatus according to the present invention, the behavioral description can be described in a format in which a circuit of hardware is divided into blocks by function unit of the circuit, the behavioral description can designate an operation clock to each of function blocks, and the behavioral description can make a designation such that the function blocks operate in parallel.

More preferably, in a hardware verification programming description generation apparatus according to the present invention, C language is used as the general programming language.

More preferably, in a hardware verification programming description generation apparatus according to the present invention, the clock domain division section divides the hardware into blocks corresponding to the clock systems in accordance with a description regarding the parallel operation of the blocks and an operation clock that is designated to each of the blocks based on the behavioral description.

More preferably, in a hardware verification programming description generation apparatus according to the present invention, in addition to the clock domain division, the clock domain division section creates control information for clock domains that includes a name of each of the clock domains indicating the block and a value of a clock cycle of each of the clock domains and that controls the order of the computations of the clock precision models for the respective blocks of the clock systems.

A high-level-synthesis apparatus according to the present invention performs a high-level synthesis on a circuit of hardware operating in accordance with a multi-phase clock, based on the behavioral description, and verifying the high-level synthesized hardware using a hardware verification programming description generated by a hardware verification programming description generation apparatus according to the present invention described above, thereby the objective described above being achieved.

A hardware verification programming description generation method according to the present invention includes: a behavior synthesis step, for a circuit of hardware that operates in accordance with a multi-phase clock, for dividing the hardware into blocks corresponding to clock systems and performing a behavior synthesis on each of the divided blocks, based on a behavioral description, the behavioral description only describing a process behavior of the hardware but does not describe information regarding a structure of the hardware; and a clock precision model generation step for generating clock precision models using the behavior synthesized data, the clock precision model capable of verifying the hardware at a cycle precision level, thereby the objective described above being achieved.

Preferably, a hardware verification programming description generation method according to the present invention further includes: a clock control model generation step for generating a control model for controlling the order of the computations of the clock precision models for the respective blocks of the clock systems when the hardware is simulated at the cycle precision level.

More preferably, in a hardware verification programming description generation method according to the present invention, the behavior synthesis step includes: a behavior description analysis step for analyzing the behavioral description of the hardware and obtaining behavior information of the hardware; a clock domain division step for dividing the hardware into blocks corresponding to the clock systems based on the behavior information of the hardware; and a control data flow graph generation step for creating a control data flow graph for the respective blocks of the clock systems based on the behavioral description of the hardware, the control data flow graph representing the behavior of the hardware using nodes and branches connecting between the nodes.

More preferably, in a hardware verification programming description generation method according to the present invention, the clock precision model generation step includes: a scheduling/state allocation step for scheduling the nodes in the control data flow graph as the behavior-synthesized data according to respective clock frequencies of the blocks and allocating the nodes for respective states; and a cycle precision model generation step for generating behavior models as the clock precision models for each of the states, the behavior models capable of verifying the hardware at a cycle precision level using a result obtained from the scheduling/state allocation.

More preferably, in a hardware verification programming description generation method according to the present invention, the hardware verification programming description generation method generates at least one of the clock precision models and the control model as a description represented by a general programming language.

More preferably, in a hardware verification programming description generation method according to the present invention, the clock control model generation step compares times, at which the computations of the cycle precision models for the respective blocks of the clock systems are performed, selects a time which is the shortest up to when a computation is performed and selects the block of the clock system corresponding to the time as a block on which the computation is performed, for the selected block, the clock control model generation step updates a time at which a next computation of the cycle precision model is performed to a value of a clock cycle of the selected block, for a block other than the selected block, the clock control model generation step subtracts the shortest time from a time up to when a cycle precision model is computed, and the clock control model generation step sequentially repeats, in a similar manner, a process for selecting a time which is the shortest up to when a computation is performed and selecting a block corresponding to the time, and a process for updating the time up to when a next computation of a clock precision model is performed.

More preferably, in a hardware verification programming description generation method according to the present invention, the clock control model generation step repeats a process of: computing a time corresponding to a greatest common denominator of clock cycles for the blocks of the respective clock systems, adding the time corresponding to the greatest common denominator to each of values of respective counters that shows a time at which a computation of a cycle precision model is performed on a corresponding block of a clock system, when the clock cycle for each of the blocks of the respective clock systems and the value of the corresponding counter match each other, determining that the computation of the clock precision model for the block is to be performed, and initializing the value of the counter for which the computation of the clock precision model for the block has been performed, and for the other blocks, determining that the computations of the clock precision models for the respective blocks are not to be performed, and adding the time corresponding to the greatest common denominator to the values of the respective counters.

More preferably, in a hardware verification programming description generation method according to the present invention, the clock control model generation step analyzes, based on the behavioral description of the hardware, times at which operations of circuits designated to respective clock systems are started and controls times at which the computations of the clock precision models for the respective blocks of the clock systems are started.

A hardware verification program generation method according to the present invention compiles and linking a description of a clock precision model and a description of a clock control model generated by a hardware verification programming description generation method according to the present invention described above so as to generate a program having an execution format that can verify, at a cycle precision level, a process behavior of hardware operating in accordance with a multi-phase clock, thereby the objective described above being achieved.

A control program according to the present invention has a procedure of processes described thereon for causing a computer to execute a hardware verification programming description generation method according to the present invention described above, thereby the objective described above being achieved.

A control program according to the present invention, which is a hardware verification program generated by a hardware verification program generation method according to the present invention, having a procedure of processes of the hardware verification program described thereon for causing a computer to execute the hardware verification program, thereby the objective described above being achieved.

A computer readable recording medium according to the present invention has a control program according to the present invention described above recorded thereon, thereby the objective described above being achieved.

Hereinafter, the functions of the present invention having the structures described above will be described.

The present invention divides hardware into blocks corresponding to clock systems, generates a cycle precision model, which can verify the hardware at a cycle precision level, for each of the divided blocks (clock domains) and generates a control model that controls the order of the computations (simulations) of cycle precision models for the respective clock domains. Therefore, it is possible to verify, at the cycle precision level, a process behavior of a circuit of the hardware operating in a multi-phase clock. In addition, since the models are generated as general programming language descriptions, it is possible to perform a verification of the behavior of the circuit without using a HDL simulator which requires much cost and time.

Further description will be given. First, the behavioral description of the circuit of the hardware operating in accordance with a multi-phase clock is analyzed, the hardware is divided into blocks corresponding to clock systems having different cycles from each other, and CDFG data are generated for the blocks of the respective clock systems, based on the behavioral description of the hardware. Next, the CDFG data are scheduled according to clock frequencies for the respective blocks and allocated for respective states. The cycle precision models of the hardware are generated as descriptions represented by a general programming language for the respective states. The control model is generated as a description represented by a general programming language for controlling the order of the computations of the cycle precision models for the respective blocks of the clock systems at the time of the simulation (verification) of the behavior of the circuit of the hardware. Therefore, in the circuit of the hardware operating in accordance with a multi-phase clock, it is possible to control the computations of the cycle precision models corresponding to the respective clock systems and to perform the verifications at the cycle precision level in a sequential manner.

For example, times, at which the computations of the cycle precision models for the respective blocks of the clock systems are performed, are compared, and a time which is the shortest up to when a computation is performed and a block of a clock system corresponding to the time are selected. For the selected block, a time at which a next computation of the cycle precision model has been performed is updated to the value of the clock cycle of the selected block, and for a block other than the selected block, the shortest time is subtracted from a time up to when a cycle precision model is computed. The processes described above are repeatedly performed. Therefore, it is possible to control the order of the computations of the cycle precision models.

In addition, for example, a time corresponding to the greatest common denominator of the clock cycles for the respective blocks of the clock systems is computed. The time corresponding to the greatest common denominator is added to each of the values of respective counters that shows the time at which the computation of the cycle precision model is performed on the corresponding block of the clock system. When the clock cycle for each of the blocks of the respective clock systems and the value of the corresponding counter match each other, it is determined that the computation of the cycle precision model for that block is to be performed. The value of the counter for which the computation of the cycle precision model for the block has been performed is initialized. For the other blocks, it is determined that the computations of the cycle precision models for the respective blocks are not to be performed, and the time corresponding to the greatest common denominator is added to the values of the respective counters. The processes described above are repeatedly performed. Therefore, it is possible to control the order of the computations of the cycle precision models.

By analyzing, based on the behavioral description of the hardware, the times at which the operations designated to the respective clock systems are started and by providing an offset time to each of clock systems, it is possible to control the times at which the computations of the cycle precision models for the respective blocks of the clock systems are started.

By compiling and linking the descriptions of the cycle precision models and the description of the control model for the clock domains generated in this manner, it is possible to generate a hardware verification program having an execution format that can verify, at the cycle precision level, a behavior of hardware operating in accordance with a multi-phase clock As described above, the present invention divides hardware into blocks corresponding to clock systems, generates a cycle precision model, which can verify the hardware at a cycle precision level, for each of the divided blocks (clock domains) and generates a control model that controls the order of the computations (simulations) of cycle precision models for the respective clock domains. Therefore, it is possible to verify, at the cycle precision level, a behavior of a circuit of the hardware operating in a multi-phase clock. Further, the models are generated as general programming language descriptions. Thus, it is possible to perform a verification at a higher speed and at a lower cost compared to the verification a behavior of a circuit by a HDL simulator. Therefore, the time periods required for the design and verification in a development of LST can be significantly shortened, and the development cost for the system LSI can be decreased.

These and other advantages of the present invention will become apparent to those skilled in the art upon reading and understanding the following detailed description with reference to the accompanying figures.

DESCRIPTION OF THE PREFERRED EMBODIMENTS

A hardware verification programming description generation apparatus according to the present invention is used to generate a hardware verification programming description that is used in order to perform a simulation (verification) of a process behavior of hardware including a multi-phase clock at a cycle precision level when a circuit of hardware operating in accordance with a multi-phase clock is high-level synthesized at a high-level synthesis apparatus.

Herein, the high-level synthesis of hardware is performed by using a high-level synthesis apparatus, and it refers to a technique for circuit design for automatically generating a logical circuit of register transfer level (RTL) by a computer, based on a behavioral description, which only describes a process behavior of hardware but does not describe information regarding a structure of the hardware. This high-level synthesis method is described in detail, for example, in Reference 3, and thus the detailed description thereof will be omitted herein. In the high-level synthesis of hardware operating in accordance with a multi-phase clock to be described in the present embodiment, the behavioral description can be described in a format in which a circuit of hardware is divided into blocks by function unit. The behavioral description can designate an operation clock to each of the function blocks, and it can also make a designation such that the function blocks operate in parallel. In addition, a model that can verify the hardware generated according to the present embodiment at the cycle precision level is described by C language that is a general programming language. Alternatively, the model can be similarly described by a language other than C language.

Hereinafter, a hardware verification programming description generation apparatus according to the present invention and a hardware verification programming description generation method using the hardware verification programming description generation apparatus will be described in detail by way of illustrative embodiments with reference to the accompanying drawings.

Figure 1:
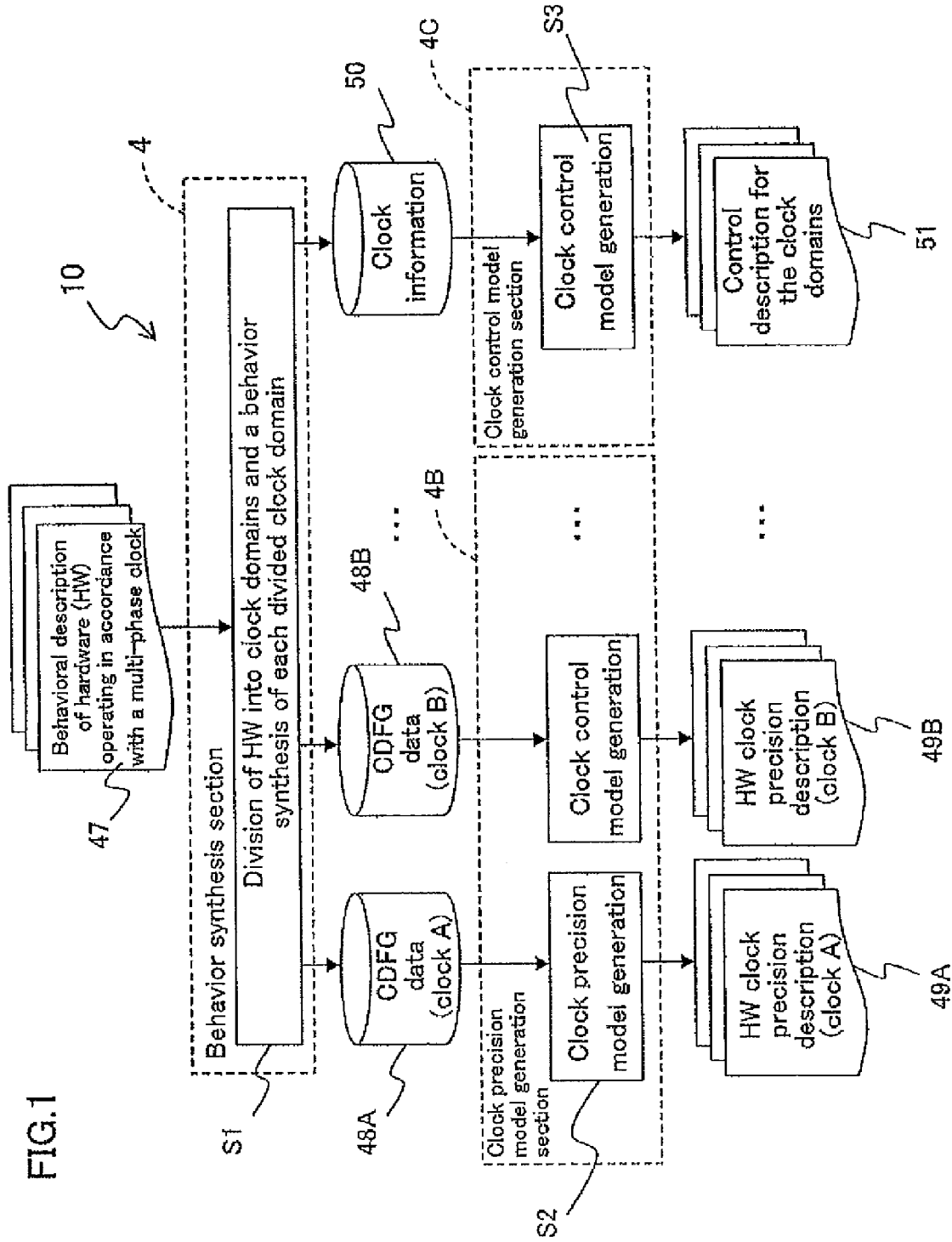
FIG. 1 is a fundamental processing diagram of a computer system functioning as a hardware verification programming description generation apparatus according to an embodiment of the present invention.

FIG. 1 is a fundamental processing diagram of a computer system functioning as a hardware verification programming description generation apparatus 10 according to an embodiment of the present invention.

In FIG. 1, the computer system 10 functioning as the hardware verification programming description generation apparatus 10 according to the embodiment includes: a behavior synthesis section 4A, for a circuit of hardware that operates in accordance with a multi-phase clock, for dividing the hardware into blocks corresponding to clock systems and performing a behavior synthesis on each of the divided blocks, based on a behavioral description 47, which only describes a process behavior of the hardware but does not describe information regarding a structure of the hardware (step S1); and a clock precision model generation section 4B for generating a clock precision model using the behavior-synthesized data (CDFG data), wherein the clock precision model can verify the hardware at a cycle precision level (step S2); and a clock control model generation section 4C for generating a control model for controlling the order of the computations of the clock precision models for the respective blocks of the clock systems when the hardware is simulated at the cycle precision level (step S3).

With the structure described above, first, in the behavior synthesis in step S1, a circuit of hardware (hardware 5 in FIG. 4 to be described later) that operates in accordance with a multi-phase clock and that is to be verified is divided into a plurality of function blocks (clock domains) corresponding to clock systems for circuits having different cycles from each other. CDFG data 48A, 48B . . . for the respective clock domains are generated based on the behavioral description 47 of the circuit of hardware that operates in accordance with a multi-phase clock.

Next, in the clock model generation in step S2, the CDFG data 48A/48B . . . are scheduled in accordance with respective operating frequencies required by a hardware specification, and the CDFG data 48A, 48B . . . are allocated for respective states. A behavior model for each of the nodes is generated by using behavior information for the node included in each of the CDFG data 48A, 48B . . . and the order of the computations of the behavior models for the respective nodes using node connection information is decided. Therefore, the models that can be simulated at the respective states are generated, and HW clock precision descriptions 49A, 49B . . . that can verify the hardware at the cycle precision level are generated.

Further, in the control model generation in step S3 for the clock domains, the control model that controls the order of the computations of the cycle precision models of the respective clock domains is generated as a control description 51 for the clock domains, based on control information 50 for the clock domains which has been generated in the behavior synthesis in step S1.

As described above, a hardware model that can be verified at a clock precision level for each clock domain is generated in a programming description as each of the respective HW clock precision descriptions 49A, 49B . . . . By comparing the cycles of the clocks, a clock domain that is advanced by one clock of the state of a model is selected, and the hardware is simulated. In this manner, according to the present invention, a programming description that selects a clock domain and that controls for advancing the state of a model is generated.

As described above, a circuit of hardware to be verified is divided into clock domains corresponding to clock systems, cycle precision models (HW clock precision descriptions 49A, 49B . . . ) that can verify, at a cycle precision level, the hardware for the respective divided clock domains are generated, and a control model (control description 51 for the clock domains) that controls the order of the computations (simulations) of the models for the respective clock domains is generated. Therefore, it is possible to verify, at the cycle precision level, the behavior of a circuit of hardware that operates in accordance with a multi-phase clock. Further, the models are generated as general programming language descriptions. Thus, it is possible to perform a verification at a higher speed and at a lower cost compared to the verification of the behavior of a circuit by a HDL simulator.

Hereinafter, the computer system 10 functioning as the hardware verification programming description generation apparatus according to the present embodiment described above and the hardware verification programming description generation method using the computer system 10 will be described further in detail.

Figure 2:
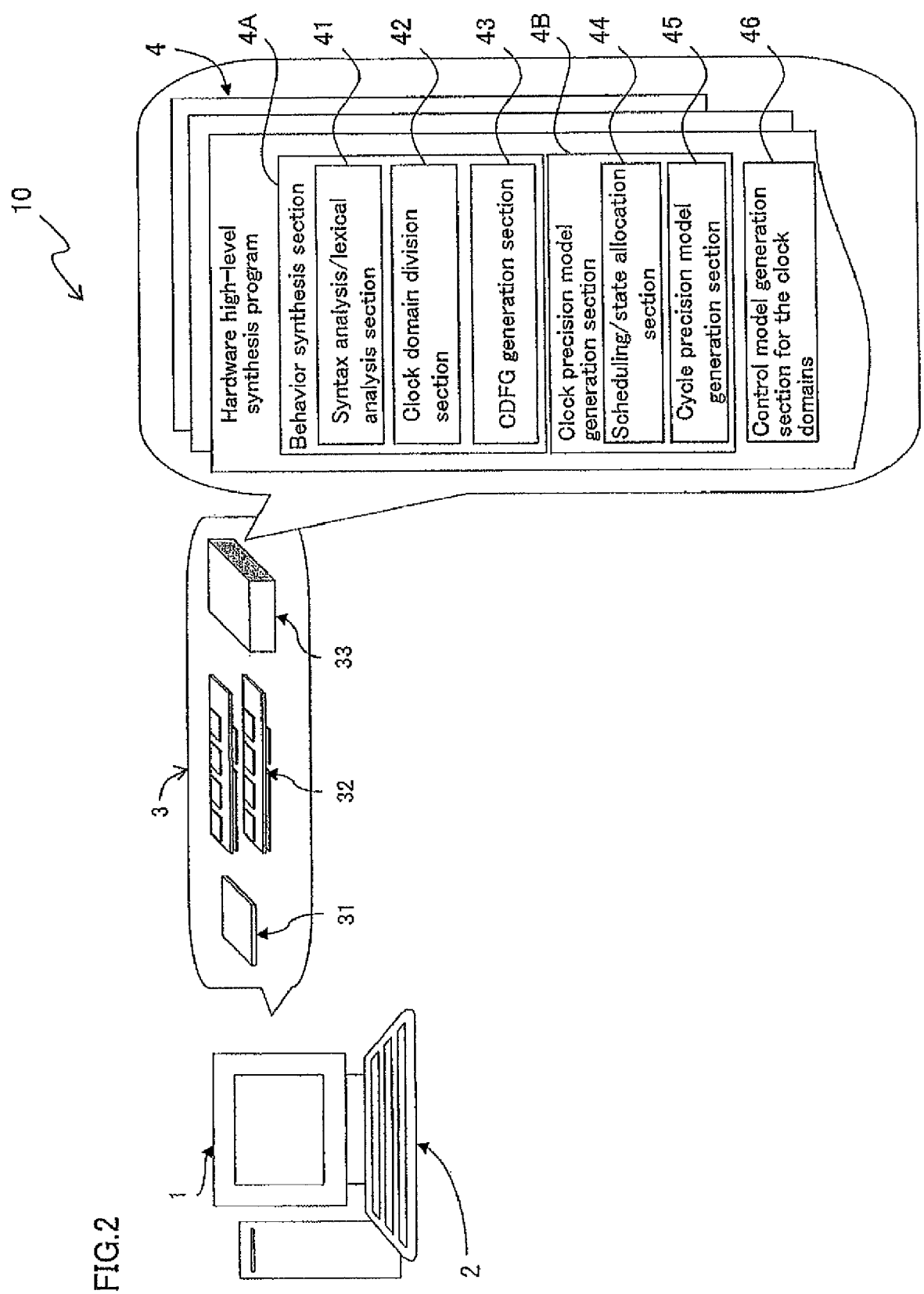
FIG. 2 is a block diagram showing an exemplary essential structure of the computer system in FIG. 1.

FIG. 2 is a block diagram showing an exemplary essential structure of the computer system 10 in FIG. 1.

In FIG. 2, the computer system 10 functioning as the hardware verification programming description generation apparatus according to the present embodiment includes: a monitor device 1 provided with a display screen for displaying a variety of information (e.g., input information, information obtained as a result of processing or the like); an input device 2 (e.g., keyboard, mouse or the like) for inputting instructions for a variety of operations to be input; and a computer body 3 for executing a variety of processes based on the instructions for a variety of operations that are input from the input device 2 and for controlling the display of the monitor device 1.

The computer body 3 includes: a control section 31 including a CPU (control processing unit) for executing a hardware verification function according to the present embodiment; a computer-readable recording medium 32 (e.g., hard disc, internal memory or the like) for storing a variety of control programs executed by the control section 31 and data thereof; and a computer-readable recording medium 33 (e.g., semi-conductor memory, optical disc, magnetic disc or the like) that is a small-sized portable memory for storing a variety of control programs and data thereof.

The internal memory of the computer-readable recording medium 32 reads the variety of control programs, the data thereof and the like from the hard disc of the computer-readable recording medium 32 when the CPU is activated and functions as a work memory (RAM), or the internal memory of the computer-readable recording medium 32 reads the variety of control programs, the data thereof and the like from the Internet, intranet, the computer-readable recording medium 33 or the like and functions as a work memory (RAM).

The computer-readable recording medium 33 (e.g., magnetic disc) is a small-sized portable memory. A hardware high-level synthesis program 4 as a variety of control programs (e.g., hardware verification programming description generation program, simulation program (hardware verification program) or the like) is stored in the computer-readable recording medium 33. The hardware high-level synthesis program 4 is for causing a computer to execute the procedure of processes of the hardware verification programming description generation method according to the present embodiment.

The hardware verification programming description generation method (hardware high-level synthesis program 4) is executed by the control section 31, and it includes: a syntax analysis/lexical analysis section 41 (behavioral description analysis section) for performing a syntax analysis/lexical analysis on the behavioral description 47 of a circuit of hardware that operates in accordance with a multi-phase clock; and a clock domain division section 42 for dividing the hardware into function blocks (clock domains) corresponding to clock systems and for creating control information for the clock domains that includes a name of each of the clock domains and a value of a clock cycle of each of the clock domains and that controls the order of the computations of the cycle precision models for the respective clock domains; a CDFG generation section 43 for generating CDFGs corresponding to the clock domains, respectively, based on the behavioral description 47 of the hardware; a scheduling/state allocation section 44 for scheduling the circuits of the clock domains so as to operate at clock frequencies for the respective clock domains and for allocating the circuits for respective states; a cycle precision model generation section 45 for generating clock precision models (cycle precision models) for respective states as cycle precision descriptions for the respective clock domains that can verify the hardware at a cycle precision level; and a control model generation section 46 for the clock domains (clock control model generation section 4C) for generating a control model as a control description for the clock domains for controlling the order of the computations of the clock precision models for the respective clock domains.

The behavior synthesis section 4A includes the syntax analysis/lexical analysis section 411 the clock domain division section 42 and the CDFG generation section 43. The behavior synthesis section 4A performs a behavior synthesis on each of the divided blocks of the hardware corresponding to the clock systems, based on the behavior description 47 of the hardware operating in accordance with a multi-phase clock.

The clock precision model generation section 4B includes the scheduling/state allocation section 44 and the cycle precision model generation section 45. The clock precision model generation section 4B generates a clock precision model using the behavior-synthesized data, wherein the clock precision model can verify the hardware at the cycle precision level.

Hereinafter, the procedure of the processes of the hardware verification programming description generation method according to the embodiment of the present invention will be described with reference to a flowchart in FIG. 3.

Figure 3:
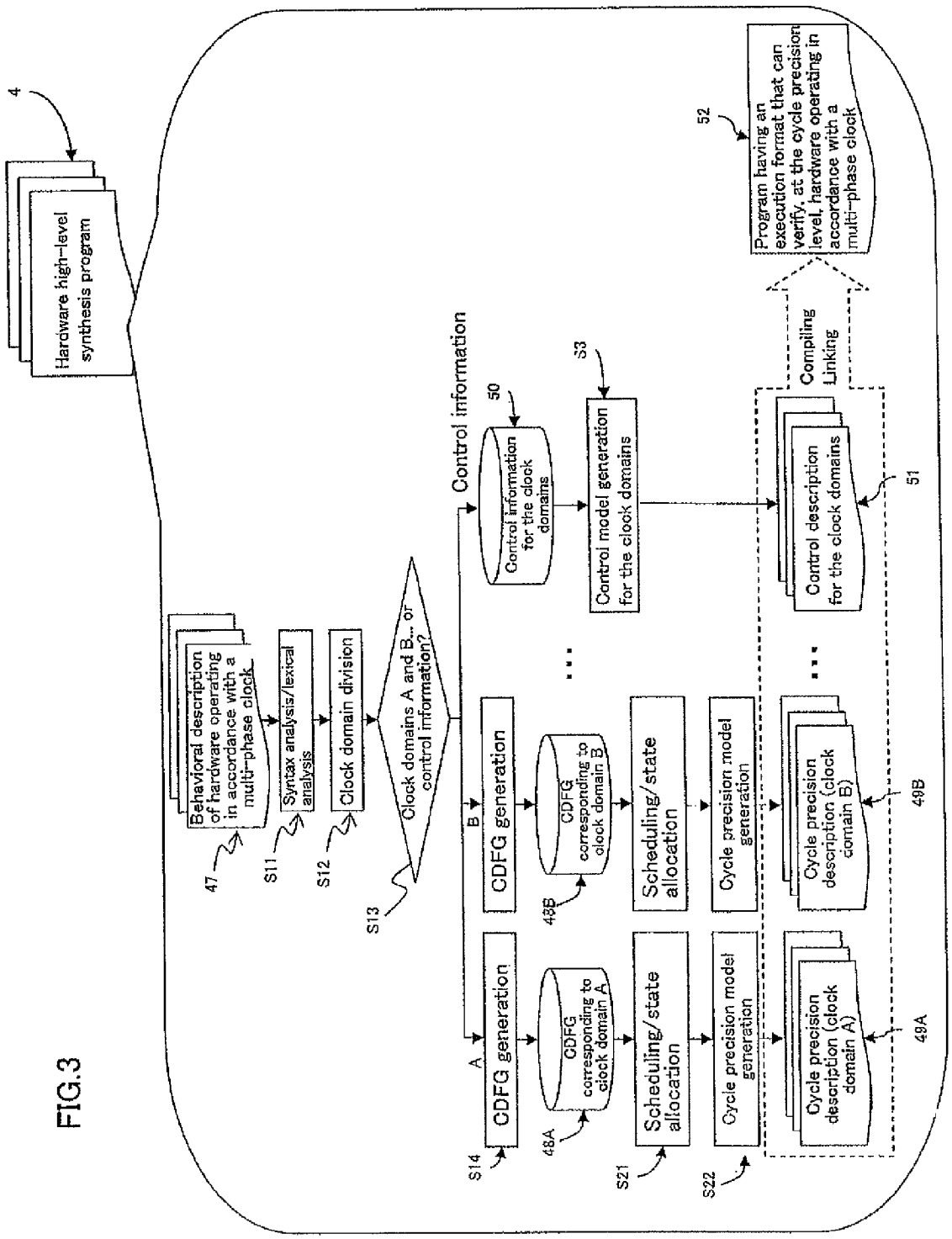
FIG. 3 is a flowchart showing the procedure of processes of a hardware verification programming description generation method using the computer system in FIG. 2.

FIG. 3 is a block diagram showing an exemplary hardware structure of the hardware verification programming description generation apparatus 10 according to the embodiment of the present invention, and FIG. 3 is also a flowchart showing the operations of the hardware verification programming description generation apparatus 10.

As shown in FIG. 3, first, in the control section 31, based on the hardware verification programming description generation program and the data thereof, the behavioral description 47, which only describes a process behavior of hardware hut does not describe information regarding a structure of the hardware, is syntax-analyzed/lexicon-analyzed by the syntax analysis/lexical analysis section 41 in step S11, wherein the circuit of the hardware operates in accordance with a multi-phase clock.

Next, in step S12, the hardware is divided into function blocks corresponding to clock systems by the clock domain division section 42. The clock domain division section 42 divides the hardware into the function blocks (clock domains) that are gathered in accordance with the clock systems in accordance with a description regarding a parallel operation of function blocks and an operation clock that is designated to each of the function blocks based on the analyzed behavioral description 47 of the hardware.

The following description denotes the function blocks divided in such a manner as clock domains. An exemplary description regarding a parallel operation of function blocks and a designation of an operation clock will be described below.

```
#pragmaparallel
#pragmaclock A
{
    FunctionA( );
}
#pragmaclock B
{
    FunctionB( );
}
#pragmaclock C
{
    FunctionC( );
}
```

In the exemplary description described above, the descriptions enclosed by { } after #pragma parallel are high-level synthesized as function block circuits that operate in parallel. In addition, the descriptions enclosed by { } after #pragma-clock are high-level synthesized as function blocks of respective clock systems using the numerical values A, B and C after #pragmaclock as clock cycles. In the example, FunctionA( ), FunctionB( ) and FunctionC( ) are functions representing the behaviors of the circuits, respectively.

Next in step S13, it is determined if the clock domains divided by the clock domain division section 42 are clock domain A having cycle A, clock domain B having cycle B . . . or control information for the clock domains.

After the hardware is divided by the clock domain division section 42 into a plurality of types of clock domains having different cycles as described above, the CDFGs 48A, 48B, . . . corresponding to the clock domains A, B, . . . are created in step S14, based on the behavioral description 47 of the hardware, by the CDFG generation section 43 for the respective clock domains A, B . . .

In the example shown in FIG. 1, the CDFG 48A for the clock domain A is created by the CDFG generation section 43, and the CDFG 48B for the clock domain B is created by the CDFG generation section 43. The CDFG refers to a graph in which behaviors of hardware are represented by nodes and branches connecting between the nodes. A node indicates a computation and the like to be executed within the hardware. A branch between nodes shows a flow of data. Data that is output from a node passes through a branch having one end thereof connected to the node, and it is used as an input for a node connected to the other end of the branch.

Further, in step S21, the nodes in the generated CDFGs 48A, 48B . . . are scheduled by the scheduling/state allocation section 44 such that the circuits of the nodes operate at clock frequencies for the respective clock domains, and the nodes are allocated for respective states.

In step S22, using the result obtained by the scheduling/state allocation, models that can verify the hardware at a cycle precision level are generated, for the respective states, by the cycle precision model generation section 45, as the cycle precision description 49A for the clock domain A, the cycle precision description 49B for the clock domain B, . . . represented by C language that is a general programming language.

By performing the computations of the cycle precision models, the state of a circuit of a clock domain is advanced by one clock in the time-axis direction. The method for generating, based on a CDFG, a model, which can verify the hardware at the cycle precision level, is described in detail, for example, in Reference 2. As such, the description thereof will be omitted herein.

The clock domain division section 42 creates the control information 50 for the clock domains that includes a name of each of the clock domains and a value of a clock cycle of each of the clock domains and that controls the order of the computations of the cycle precision models for the respective clock domains. When it is determined to be the control information for the clock domains in step S13, a control model for controlling the order of the computations of the cycle precision models for the respective clock domains is generated in step S3, by the control model generation section 46 for the clock domains using the control information 50 for the clock domains, as the control description 51 for the clock domains represented by C language that is a general programming language.

By making a link between the objects created as a result of compiling the cycle precision descriptions (cycle precision models) 49A, 49B, . . . and the control description 51 for the clock domains generated in this manner, a hardware verification program 52 having an execution format that can verify, at the cycle precision level, a behavior of hardware operating in accordance with a multi-phase clock is generated. By executing the hardware verification program 52 on the computer system 10, it is possible to verify whether the hardware satisfies the required specification at the cycle precision level.

Next, a method for controlling the order of the computations of the cycle precision models for the respective clock domains will be described.

Figure 4:
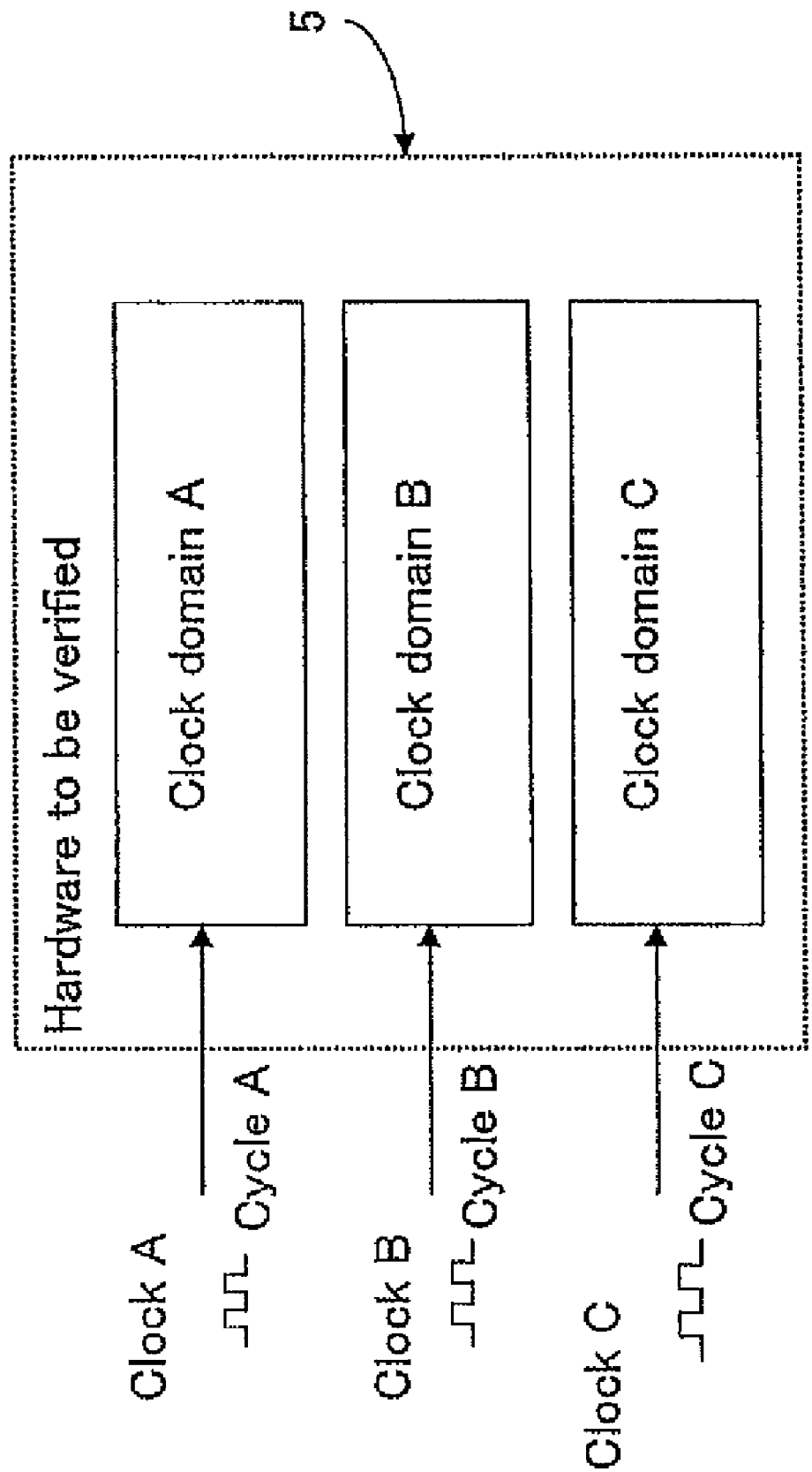
FIG. 4 is a block diagram showing an example of clock domains that operate in parallel in hardware operating in accordance with a multi-phase clock.

FIG. 4 is a diagram for describing a method for controlling the order of the computations of the cycle precision models for the respective clock domains in the control description 51 for the clock domains created according to the embodiment of the present invention. FIG. 4 is also a diagram showing an example of clock domains that operate in parallel in the hardware operating in accordance with a multi-phase clock.

In FIG. 4, as a multi-phase clock, three systems of clock A, clock B and clock C having different cycles from each others are used for the hardware 5 to be verified. Clock cycles of the respective clocks A to C are denoted as cycle A of the clock A, cycle B of the clock B and cycle C of the clock C, respectively. In addition, for clock domains operating in accordance with the respective clocks A to C, clock domain A operates in accordance with the clock A, clock domain B operates in accordance with the clock B, and clock domain C operates in accordance with the clock C.

Figure 5:
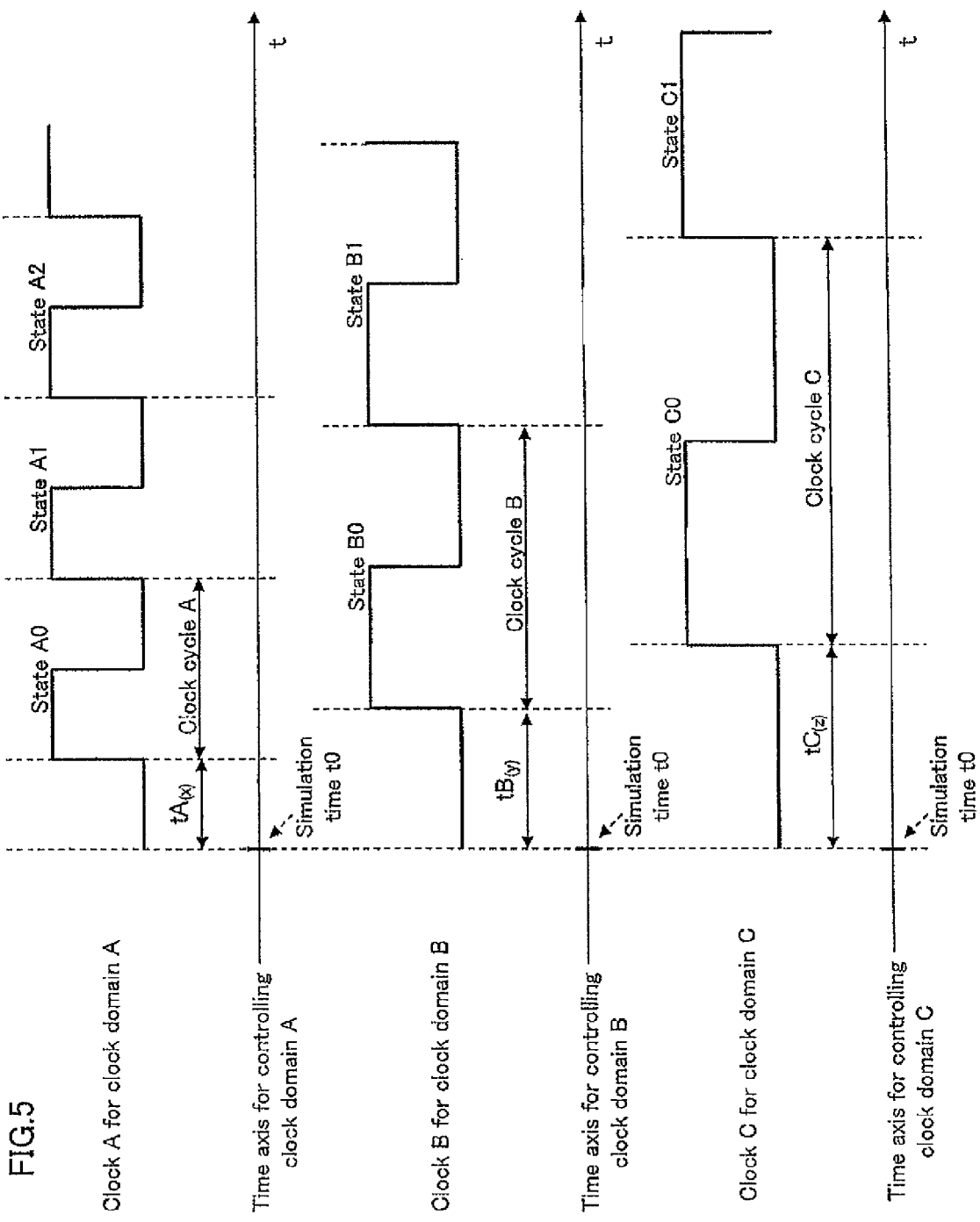
FIG. 5 is a signal waveform diagram representing the state of each of clock A, clock B and clock C in FIG. 4 using High and Low of a hardware signal.
Figure 6:
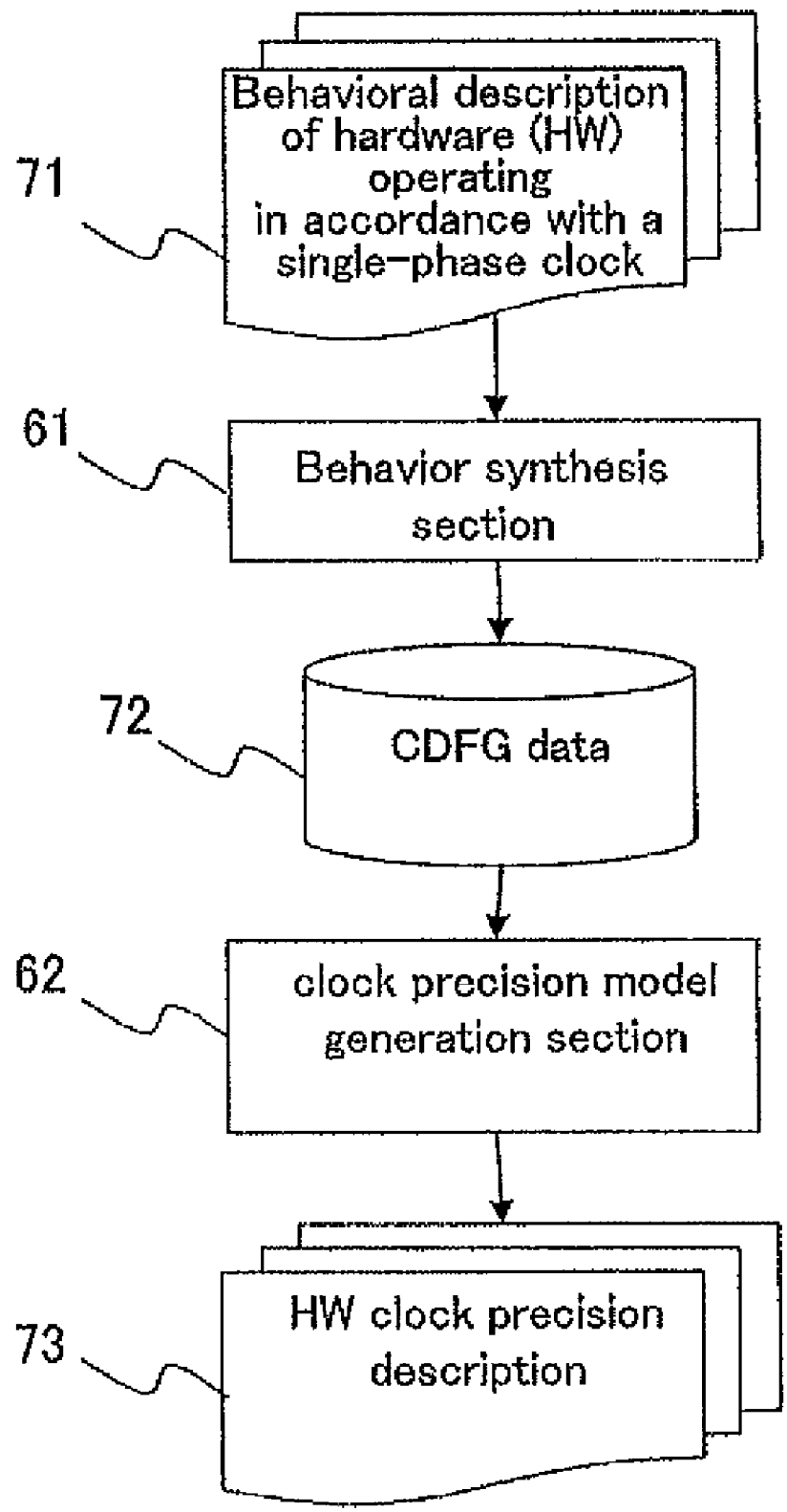
FIG. 6 is a block diagram showing an exemplary essential structure of a conventional hardware verification programming description generation apparatus.

FIG. 5 is a diagram for describing a method for controlling the order of the computations of the cycle precision models for the respective clock domains in the control description 51 for the clock domains created according to the embodiment of the present invention. FIG. 5 is also a signal waveform diagram representing the state of each of the clock A, the clock B and the clock C in FIG. 4 using High and Low of a hardware signal.

In FIG. 5, the vertical axis indicates a signal level, and the horizontal axis indicates time axis t for controlling each of the clock domains. In the hardware in FIG. 4, the state of a circuit of a clock domain changes at the timing when that state of a clock rises from Low to High.

In the verification using a cycle precision model, a change of the state of a circuit is simulated by executing the computation of the model. The change of the state of a circuit refers to the change of a value of a memory element (e.g., register) included inside the circuit of a clock domain and/or the change of a value that is output to outside the circuit.

For the clock A, the clock B and the clock C in FIG. 5, the changes of the states of the respective clock domain A, clock domain B and clock domain C that are clock domains for the respective clocks A to C are shown as in the following.

The change of the state of the clock domain A State A0→State A1→State A2

The change of the state of the clock domain B State B0→State B1

The change of the state of the clock domain C State C0→State C1

As a method for controlling the order of the computations of the cycle precision models for the respective clock domains, the following three methods can be used, for example. In the following description, a simulation time using a cycle precision model is denoted as t, and in the simulation time t, "0" is set as an initial value (t0).

Control Method (1)

In the control method (1), times, at which the computations of the cycle precision models for the function blocks (clock domains A to C) of the respective clock systems in the hardware 5 are performed, are compared. The process for selecting a time which is the shortest up to when a computation is performed and for selecting the block of the clock system as a block on which the computation is performed, and the process for updating the time up to when a next computation of a cycle precision model is performed are repeated.

The process for selecting the time which is the shortest up to when a computation is performed and for selecting the function block (model for a clock domain) of the clock system is represented by the following expression.

$$D(x,y,z)=\min(tA(x),tB(y),tC(z))$$

In the above expression, min( ) is a function for selecting a model for the clock domain having the smallest value among given arguments.

In FIG. 5, the time from the simulation time t up to when the model for the clock domain A is computed is denoted as tA(x), the time from the simulation time t up to when the model for the clock domain B is computed is denoted as tB(y), and the time from the simulation time t up to when the model for the clock domain C is computed is denoted as tC(z). Herein, the value of each of x, y and z indicates the number of the executions of the computation for each of the clock domains, that is, the number of the changes of the state of each of the clock domains. Cycle precision model D (x, y, z) for a clock domain on which a computation is performed is a model for the clock domain having the smallest value among the times tA(x), tB(y) and tC(z). For example, when the relationship $$tA(x)<tB(y)<tC(z)$$

is established, the cycle precision model D (x, y, z) is a model for the clock domain A.

After the model for the selected clock domain A is computed and the change of the state of the circuit thereof is simulated, the simulation time t and the values of the time tA(x), the time tB(y) and the time tC(z) are updated. In the updating process, for the selected block on which the computation has been performed, a time at which a next computation of the cycle precision model is performed is updated to the value of the clock cycle of the selected block. In addition, for a block on which no computation has been performed, the shortest time is subtracted from a time up to when a cycle precision model is computed. The updating process is represented by the following expressions.

$$t=t+tA(x)$$

$$tA(x+1)=A$$

$$tB(y)=tB(y)-tA(x)$$

$$tC(z)=tC(z)-tA(x)$$

Next, the process for selecting the time which is the shortest up to when a computation is performed and for selecting the block (model for a clock domain) of the clock system is represented by the following expression.

$$D(x+1,y,z)=\min(tA(x+1),tB(y),tC(z))$$

In this manner, by repeating the process for comparing times from the simulation time t up to when the models for the respective clock domains are computed, computing a model for the clock domain having the shortest time and updating the time up to when a next computation of a cycle precision model is performed, it is possible to control the order of the computations of the models for the respective clock domains.

For example, it is assumed that the time tA(x) is 1, the time tB(y) is 2 and the time tC(z) is 4, and the clock cycle A is 2, the clock cycle B is 3, and the clock cycle C is 4. In such a case, the control of the order of the computations of the models for the respective clock domains is performed as follows.

First, a model for a clock domain on which a computation is performed is selected in accordance with the following expression.

$$D(x,y,z)=\min(1,2,4)$$

According to the above expression, the cycle precision model D (x, y, z) is a model for the clock domain A.

Next, the time up to when each of the computations is performed is updated according to the following expressions, $$tA(x+1)=2$$

$$tB(y)=2-1=1$$

$$tC(z)=3-1=2$$

Next, a model for a clock domain on which a computation is performed is selected according to the following expression.

$$D(x+1,y,z)=\min(2,1,2)$$

According to the above expression, the cycle precision model D (x, y, z) is a model for the clock domain B.

Next, the time up to when each of the computations is performed is updated according to the following expressions.

$$tA(x+1)=2-1=1$$

$$tB(y+1)=3$$

$$tC(z)=2-1=1$$

Next, a model for a clock domain on which a computation is performed is selected according to the following expression.

$$D(x+1,y+1,z)=\min(1,3,1)$$

According to the above expression, the cycle precision model D (x+1, y+1, z) is a model for each of the clock domain A and the clock domain C. In this case, the two models for the respective clock domains are computed. However, the order of the computations is arbitrary. In the simulation using cycle precision models, irrespective of the order of the computations of the models for the respective clock domains, the result of the computation for each of the models is the same. As described above, the computation of a cycle precision model is to obtain the change of a value of a memory element (e.g., register) included inside the circuit of the clock domain and/or to obtain the change of a value that is output to outside the circuit. As such, even if the order of the computations of the models for the respective clock domains is changed, the computation result does not change by the order of the computations of the models since the value of an input inside the circuit remains the same. The details of such cycle precision models are described, for example, in Reference 2.

After the computations of the model for the clock domain A and the model for the clock domain C are performed, the time up to when each of computations is performed is updated according to the following expressions.

$$tA(x+2)=2$$

$$tB(y+1)=3-1=2$$

$$tC(z+1)=4$$

Next, a model for a clock domain on which a computation is performed is selected according to the following expression.

$$D(x+2,y+1,z+1)=\min(2,2,4)$$

As described above, in the control method (1) by the control model generation section 46 for the clock domains, times, at which the computations of the cycle precision models for the respective blocks of the clock systems are performed, are compared, a time which is the shortest up to when a computation is performed is selected, and a block of a clock system corresponding to the time is selected as a block on which the computation is performed. For the selected block, a time at which a next computation of the cycle precision model is performed is updated to the value of the clock cycle of the selected block, and for a block other than the selected block, the shortest time is subtracted from a time up to when a cycle precision model is computed. The process for selecting the time which is the shortest up to when a computation is performed and for selecting the block corresponding to the time, and the process for updating the time up to when a next computation of a cycle precision model is performed are sequentially repeated in a similar manner.

As described above, by repeating the process for selecting a model on which a computation is performed, and the process for updating the time up to when a next computation of each of the cycle precision models is performed, it is possible to control the order of the computations of the cycle precision models for the respective clock domains.

Control Method (2)

In the control method (2), a time corresponding to the greatest common denominator of the clock cycles for the function blocks (clock domains A to C) of the respective clock systems in the hardware 5 is computed. The time corresponding to the greatest common denominator is added to each of the values of respective counters that shows the time at which the computation of the cycle precision model is performed on the corresponding block of the clock system. When the clock cycle for each of the blocks of the respective clock systems and the value of the corresponding counter match each other, the computation of the cycle precision model for that block is performed. The value of the counter for which the computation of the cycle precision model for the block has been performed is initialized. For the other blocks, the time corresponding to the greatest common denominator is added to the values of the respective counters.

The process for determining a block on which a computation is performed is represented by the following expressions.

$$eA=exec(A-cA)$$

$$eB=exec(B-cB)$$

$$eC=exec(C-cC)$$

In exec ( ) in the above expressions, when a given argument is 0, it is determined that a model for the clock domain is to be computed. The determination result is denoted as eA, eB and eC in the respective clock domains. In addition, the values of the counters showing the times up to when the computations are performed in the respective clock domains are represented as cA, cB and cC.

After the computation of the model which has been determined to be computed is performed based on a determination result, the greatest common denominator (GCD) of the clock cycle A, the clock cycle B and the clock cycle C is added to the values of the respective counters. In addition, the greatest common denominator of the clock cycles is added to the simulation time t. This process is represented by the following expressions. It should be noted that in the description for the control method (2), the computation of the model only for the clock domain A has been performed as in the case of the control method (1) described above. The initial value of each of the counters is "0".

$$t=t+GCD$$

$$cA=0$$

$$cB=cB+OCD$$

$$cC=cC+GCD$$

Thereafter, by repeating the process for determining the execution of the computation and for adding the greatest common denominator of the clock cycles to the values of the respective counters, it is possible to control the order of the computations of the models for the respective clock domains.

For example, it is assumed that the values cA, cB and cC of the counters are 0, 0 and 0, respectively, and the clock cycle A is 2, the clock cycle B is 3 and the clock cycle C is 4. In such a case, the control of the order of the computations of the models for the respective clock domains is performed as following.

First, the greatest common denominator of the clock cycles is obtained.

In this example, since the clock cycle A is 2, the clock cycle B is 3, and the clock cycle C is 4, the greatest common denominator is 1.

Next, a block on which a computation is performed is determined according to the following expressions.

$$eA=exec(2-0)$$

$$eB=exec(3-0)$$

$$eC=exec(4-0)$$

According to the above expressions, it is determined that no computation is performed on any of the models for the clock domains.

Next, according to the following expressions, the greatest common denominator is added to the values of the respective counters.

$cA=0+1=1$ $cB=0+1=1$ $cC=0+1=1$

Next, a block on which a computation is performed is determined according to the following expressions.

$eA=exec(2-1)$ $eB=exec(3-1)$ $eC=exec(4-1)$

According to the above expressions, it is determined that no computation is performed on any of the models for the clock domains.

Next, according to the following expressions, the greatest common denominator is added to the values of the respective counters.

$cA=1+1=2$ $cB=1+1=2$ $cC=1+1=2$

Next, a block on which a computation is performed is determined according to the following expressions.

$eA=exec(2-2)$ $eB=exec(3-2)$ $eC=exec(4-2)$

According to the above expressions, it is determined that the computation of the model for the clock domain A is to be performed, and it is determined that the computations of the models for the other clock domains are not to be performed. According to the determination result, the computation of the model for the clock domain A is performed.

Next, according to the following expressions, the greatest common denominator is added to the values of the respective counters, or the value of the counter is initialized.

$cA=0$ $cB=2+1=3$ $cC=2+1=3$

Next, a block on which a computation is performed is determined according to the following expressions.

$eA=exec(2-0)$ $eB=exec(3-3)$ $eC=exec(4-3)$

According to the above expressions, it is determined that the computation of the model for the clock domain B is to be performed, and it is determined that the computations of the models for the other clock domains are not to be performed. According to the determination result, the computation of the model for the clock domain B is performed.

Next, according to the following expressions, the greatest common denominator is added to the values of the respective counters, or the value of the counter is initialized.

$cA=0+1=1$ $cB=0$ $cC=3+1=4$

Next, a block on which a computation is performed is determined according to the following expressions.

$eA=exec(2-1)$ $eB=exec(3-0)$ $eC=exec(4-4)$

According to the above expressions, it is determined that the computation of the model for the clock domain C is to be performed, and it is determined that the computations of the models for the other clock domains are not to be performed. According to the determination result, the computation of the model for the clock domain C is performed.

Next, according to the following expressions, the greatest common denominator is added to the values of the respective counters, or the value of the counter is initialized.

$cA=1+1=2$ $cB=0+1=1$ $cC=0$

As described above, in the control method (2) by the control model generation section 46 for the clock domains, a time corresponding to the greatest common denominator of the clock cycles for the blocks of the respective clock systems is computed. The time corresponding to the greatest common denominator is added to each of the values of respective counters that shows the time at which the computation of the cycle precision model is performed on the corresponding block of the clock system. When the clock cycle for each of the blocks of the respective clock systems and the value of the corresponding counter match each other, it is determined that the computation of the cycle precision model for that block is to be performed. The value of the counter for which the computation of the cycle precision model for the block has been performed is initialized. For the other blocks, it is determined that the computations of the cycle precision models for the respective blocks are not to be performed, and the time corresponding to the greatest common denominator is added to the values of the respective counters. The processes described above are repeatedly performed.

As described above, by repeating the process for determining a cycle precision model on which a computation is performed and for adding the greatest common denominator of the clock cycles to the values of the respective counters or for initializing the value of the counter, it is possible to control the order of the computations of the cycle precision models for the respective clock domains.

Control Method (3)

In the control method (3), as a method for controlling the order of the computations of the cycle precision models for the respective clock domains, a method for analyzing, based on a behavioral description of hardware, the times at which the operations designated to respective clock systems are started and for controlling the times at which the computations of the cycle precision models for the respective blocks of the clock systems are started will be described.

The time at which each of the computation of the cycle precision models for the corresponding clock domain starts refers to a delay time from the initial value 0 of the simulation time t, and the time shows an offset time. In the present embodiment, offset times up to when the computations of the cycle precision models for the respective clock domains start are designated to the behavioral description of hardware. The process for designating the offset times to the behavioral description is represented, for example, by the following expressions.

```
#pragmaparallel
#pragmaclock A
#pragmaoffset offsetA
{
    FunctionA( );
}
#pragmaclock B
#pragmaoffset offsetB
{
    FunctionB( );
}
#pragmaclock C
#pragmaoffset offsetC
{
    FunctionC( );
}
```

In the above expressions, the values after #pragma offset are offset times, and the clock domains enclosed by { } subsequent thereto are high-level synthesized. In the above example, offset time offset A is designated to the clock domain for Function A( ), offset time offset B is designated to the clock domain for Function B( ), and offset time offset C is designated to the clock domain for Function C( ).

In the control method (1) for controlling the order of the computations of the cycle precision models for the respective clock domains described above, the values of tA(0), tB(0) and tC(0) shown in FIG. 5 are designated as offset times. In addition, in the control method (2), the initial values of the values cA, cB and cC of the counters at the time when the simulation of the hardware is started are designated as offset times.

Therefore, by designating the offset times to the behavioral description of the hardware, it is possible to analyze, based on the behavioral description of the hardware, the times at which the operations designated to the respective clock systems are started and to control the times at which the computations of the cycle precision models for the respective blocks of the clock systems are started As described above, according to the embodiment described above, the behavioral description 47 of the hardware operating in accordance with a multi-phase clock is analyzed by the syntax analysis/lexical analysis section 41, the hardware is divided by the clock domain division section 42 into the clock domains corresponding to clock systems, and the CDFG 48A, 48B, . . . are generated by the CDFG generation section 43 for the respective clock domains. The CDFG 48A, 48B, . . . are scheduled by the scheduling/state allocation section 44 according to the clock frequencies for the respective blocks and they are allocated for respective states. The cycle precision models of the hardware are generated for the respective states, by the cycle precision model generation section 45, as descriptions represented by a general programming language. It is possible to generate, by the control model generation section 46 for the clock domains, the control model for controlling the order of the computations of the cycle precision models for the respective clock domains at the time of the simulation as the control description 51 for the clock domains represented by a general programming language, and to control the order of the computations of the cycle precision models for the respective clock domains. Therefore, it is possible to generate a model as a general programming description that can verify, at a cycle precision level, the hardware operating in accordance with a multi-phase clock.

In addition, the embodiment described above has not made any specific description. However, as long as the present invention includes: a behavior synthesis section for dividing hardware into blocks corresponding to clock systems and for performing a behavior synthesis on each of the divided blocks, based on the behavioral description 47, which only describes a process behavior of the hardware but does not describe information regarding a structure of the hardware operating in accordance with a multi-phase clock; and a clock precision model generation section for generating a clock precision model (cycle precision model) using the behavior-synthesized data, wherein the clock precision model can verify the hardware at the cycle precision level, the objective of the present invention is achieved, in which a model as a general programming description that can verify, at the cycle precision level, a circuit of the hardware operating in accordance with a multi-phase clock is generated, a behavior of the circuit of the hardware is verified at a high speed and at a low cost, the design and verification periods for the hardware are shortened, and the development of system LSI is implemented at a low cost.

As described above, the present invention is exemplified by the use of its preferred embodiments). However, the present invention should not be interpreted solely based on the embodiment(s) described above. It is understood that the scope of the present invention should be interpreted solely based on the claims. It is also understood that those skilled in the art can implement equivalent scope of technology, based on the description of the present invention and common knowledge from the description of the detailed preferred embodiment(s) of the present invention. Furthermore, it is understood that any patent, any patent application and any references cited in the present specification should be incorporated by reference in the present specification in the same manner as the contents are specifically described therein.

INDUSTRIAL APPLICABILITY

In the field of: a hardware verification programming description generation apparatus for generating a model as a general programming description that can verify, at a cycle precision level, a process behavior of a circuit of hardware operating in accordance with a multi-phase clock; a high-level synthesis apparatus; a hardware verification programming description generation method using the hardware verification programming description generation apparatus; a hardware verification program generation method using the hardware verification programming description generation method; a hardware verification programming description generation program for causing a computer to execute the procedure of processes of the hardware verification programming description generation method; a control program (e.g., hardware verification program) using the hardware verification programming description generation program; and a computer-readable recording medium having the control program recorded thereon, the present invention divides hardware into blocks corresponding to clock systems, generates a cycle precision model, which can verify the hardware at a cycle precision level, for each of the divided blocks (clock domains) and generates a control model that controls the order of the computations (simulations) of cycle precision models for the respective clock domains. Therefore, it is possible to verify, at the cycle precision level, a behavior of a circuit of the hardware operating in a multi-phase clock. Further, the models are generated as general programming language descriptions. Thus, it is possible to perform a verification at a higher speed and at a lower cost compared to the verification a behavior of a circuit by a HDL simulator. Therefore, the time periods required for the design and verification in a development of LSI can be significantly shortened, and the development cost for the system LSI can be decreased.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A hardware verification programming description generation apparatus, comprising:
    a behavior synthesis section, for a circuit of hardware that operates in accordance with a multi-phase clock, for dividing the hardware into blocks corresponding to clock systems and performing a behavior synthesis on each of the divided blocks to produce behavior-synthesized data, based on a behavioral description, the behavioral description only describing a process behavior of the hardware but does not describe information regarding a structure of the hardware; and
    a clock precision model generation section for generating clock precision models using the behavior-synthesized data, the clock precision model suited to verifying the hardware at a cycle precision level; wherein the clock precision model generation section includes:
    a scheduling/state allocation section for scheduling nodes in a control data flow graph as the behavior-synthesized data according to respective clock frequencies of the blocks and allocating the nodes for respective states; and
    a cycle precision model generation section for generating behavior models as the clock precision models for each of the states, the behavior models suited to verifying the hardware at a cycle precision level using a result obtained from the scheduling/state allocation section.

2. A hardware verification programming description generation apparatus according to claim 1, further comprising:
    a clock control model generation section for generating a control model for controlling the order of the computations of the clock precision models for the respective blocks of the clock systems when the hardware is simulated at the cycle precision level.

3. A hardware verification programming description generation apparatus according to claim 2, wherein the hardware verification programming description generation apparatus generates at least one of the clock precision models and the control model as a description represented by a general programming language.

4. A hardware verification programming description generation apparatus according to claim 3, wherein C language is used as the general programming language.

5. A hardware verification programming description generation apparatus according to claim 2, wherein the clock control model generation section compares times, at which the computations of the cycle precision models for the respective blocks of the clock systems are performed, selects a time which is the shortest up to when a computation is performed and selects the block of the clock system corresponding to the time as a block on which the computation is performed,
    for the selected block, the clock control model generation section updates a time at which a next computation of the cycle precision model is performed to a value of a clock cycle of the selected block,
    for a block other than the selected block, the clock control model generation section subtracts the shortest time from a time up to when a cycle precision model is computed, and
    the clock control model generation section sequentially repeats, in a similar manner, a process for selecting a time which is the shortest up to when a computation is performed and selecting a block corresponding to the time, and a process for updating the time up to when a next computation of a clock precision model is performed.

6. A hardware verification programming description generation apparatus according to claim 2, wherein the clock control model generation section repeats a process of:
    computing a time corresponding to a greatest common denominator of clock cycles for the blocks of the respective clock systems, adding the time corresponding to the greatest common denominator to each of values of respective counters that shows a time at which a computation of a cycle precision model is performed on a corresponding block of a clock system,
    when the clock cycle for each of the blocks of the respective clock systems and the value of the corresponding counter match each other, determining that the computation of the clock precision model for the block is to be performed, and initializing the value of the counter for which the computation of the clock precision model for the block has been performed, and
    for the other blocks, determining that the computations of the clock precision models for the respective blocks are not to be performed, and adding the time corresponding to the greatest common denominator to the values of the respective counters.

7. A hardware verification programming description generation apparatus according to claim 2, wherein the clock control model generation section analyzes, based on the behavioral description of the hardware, times at which operations of circuits designated to respective clock systems are started and controls times at which the computations of the clock precision models for the respective blocks of the clock systems are started.

8. A hardware verification programming description generation apparatus according to claim 1, wherein the behavior synthesis section includes:
    a behavior description analysis section for analyzing the behavioral description of the hardware and obtaining behavior information of the hardware;
    a clock domain division section for dividing the hardware into blocks corresponding to the clock systems based on the behavior information of the hardware; and
    a control data flow graph generation section for creating a control data flow graph for the respective blocks of the clock systems based on the behavioral description of the hardware, the control data flow graph representing the behavior of the hardware using nodes and branches connecting between the nodes.

9. A hardware verification programming description generation apparatus according to claim 8, wherein the clock domain division section divides the hardware into blocks corresponding to the clock systems in accordance with a description regarding the parallel operation of the blocks and an operation clock that is designated to each of the blocks based on the behavioral description.

10. A hardware verification programming description generation apparatus according to claim 8, wherein in addition to the clock domain division, the clock domain division section creates control information for clock domains that includes a name of each of the clock domains indicating the block and a value of a clock cycle of each of the clock domains and that controls the order of the computations of the clock precision models for the respective blocks of the clock systems.

11. A hardware verification programming description generation apparatus according to claim 1, wherein the behavioral description can be described in a format in which a circuit of hardware is divided into blocks by function unit of the circuit,
the behavioral description can designate an operation clock to each of function blocks, and the behavioral description can make a designation such that the function blocks operate in parallel.

12. A high-level-synthesis apparatus for performing a high-level synthesis on a circuit of hardware operating in accordance with a multi-phase clock, based on the behavioral description, and verifying the high-level synthesized hardware using a hardware verification programming description generated by a hardware verification programming description generation apparatus according to claim 1.

13. A hardware verification programming description generation method, comprising:
a behavior synthesis step, for a circuit of hardware that operates in accordance with a multi-phase clock, for dividing the hardware into blocks corresponding to clock systems and performing a separate behavior synthesis on each of the divided blocks to produce behavior-synthesized data, based on a behavioral description, the behavioral description only describing a process behavior of the hardware but does not describe information regarding a structure of the hardware; and
a clock precision model generation step for generating clock precision models using the behavior-synthesized data, the clock precision model suited to verifying the hardware at a cycle precision level; wherein the clock precision model generation step includes:
a scheduling/state allocation step for scheduling nodes in a control data flow graph as the behavior-synthesized data according to respective clock frequencies of the blocks and allocating the nodes for respective states; and
a cycle precision model generation step for generating behavior models as the clock precision models for each of the states, the behavior models suited to verifying the hardware at a cycle precision level using a result obtained from the scheduling/state allocation step.

14. A hardware verification programming description generation method according to claim 13, further comprising:
a clock control model generation step for generating a control model for controlling the order of the computations of the clock precision models for the respective blocks of the clock systems when the hardware is simulated at the cycle precision level.

15. A hardware verification programming description generation method according to claim 14, wherein the hardware verification programming description generation method generates at least one of the clock precision models and the control model as a description represented by a general programming language.

16. A hardware verification programming description generation method according to claim 14, wherein the clock control model generation step compares times, at which the computations of the cycle precision models for the respective blocks of the clock systems are performed, selects a time which is the shortest up to when a computation is performed and selects the block of the clock system corresponding to the time as a block on which the computation is performed,
for the selected block, the clock control model generation step updates a time at which a next computation of the cycle precision model is performed to a value of a clock cycle of the selected block,
for a block other than the selected block, the clock control model generation step subtracts the shortest time from a time up to when a cycle precision model is computed, and
the clock control model generation step sequentially repeats, in a similar manner, a process for selecting a time which is the shortest up to when a computation is performed and selecting a block corresponding to the time, and a process for updating the time up to when a next computation of a clock precision model is performed.

17. A hardware verification programming description generation method according to claim 14, wherein the clock control model generation step repeats a process of:
computing a time corresponding to a greatest common denominator of clock cycles for the blocks of the respective clock systems, adding the time corresponding to the greatest common denominator to each of values of respective counters that shows a time at which a computation of a cycle precision model is performed on a corresponding block of a clock system,
when the clock cycle for each of the blocks of the respective clock systems and the value of the corresponding counter match each other, determining that the computation or the clock precision model for the block is to be performed, and initializing the value of the counter for which the computation of the clock precision model for the block has been performed, and
for the other blocks, determining that the computations of the clock precision models for the respective blocks are not to be performed, and adding the time corresponding to the greatest common denominator to the values of the respective counters.

18. A hardware verification programming description generation method according to claim 14, wherein the clock control model generation step analyzes, based on the behavioral description of the hardware, times at which operations of circuits designated to respective clock systems are started and controls times at which the computations of the clock precision models for the respective blocks of the clock systems are started.

19. A hardware verification programming description generation method according to claim 13, wherein the behavior synthesis step includes:
a behavior description analysis step for analyzing the behavioral description of the hardware and obtaining behavior information of the hardware;
a clock domain division step for dividing the hardware into blocks corresponding to the clock systems based on the behavior information of the hardware; and
a control data flow graph generation step for creating a control data flow graph for the respective blocks of the clock systems based on the behavioral description of the hardware, the control data flow graph representing the behavior of the hardware using nodes and branches connecting between the nodes.

20. A non-transitory computer-readable recording medium having a control program having a procedure of processes described thereon for causing a computer to execute a hardware verification programming description generation method according to claim 13.

21. A hardware verification program generation method for compiling and linking a description of a clock precision model and a description of a clock control model generated by a hardware verification programming description generation method according to claim 13 so as to generate a program having an execution format that can verify, at a cycle precision level, a process behavior of hardware operating in accordance with a multi-phase clock.

22. A non-transitory computer-readable recording medium having a control program, which is a hardware verification program generated by a hardware verification program generation method according to claim 21, having a procedure of processes of the hardware verification program described thereon for causing a computer to execute the hardware verification program.

* * * * *